(12) United States Patent
Fafard et al.

(10) Patent No.: US 6,239,449 B1
(45) Date of Patent: May 29, 2001

(54) QUANTUM DOT INFRARED PHOTODETECTORS (QDIP)

(75) Inventors: Simon Fafard; Hui Chun Liu, both of Orleans (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 09/291,020

(22) Filed: Apr. 14, 1999

Related U.S. Application Data

(60) Provisional application No. 60/084,324, filed on May 5, 1998.
(51) Int. Cl.[7] .................... H01L 29/06; H01L 31/072; H01L 31/109; H01L 31/0328; H01L 31/0336
(52) U.S. Cl. ................ 257/17; 257/21; 257/22; 438/93; 438/94
(58) Field of Search .................. 257/17, 21, 22; 438/94, 93

(56) References Cited

U.S. PATENT DOCUMENTS 5,293,050 * 3/1994 Chapple-Sokol et al. ............ 257/17
5,512,762 * 4/1996 Suzuki et al. ...................... 257/15
5,936,258 * 8/1999 Imamura et al. ................... 257/21

* cited by examiner

Primary Examiner—William Mintel
(74) Attorney, Agent, or Firm—Pascal & Associates

(57) ABSTRACT

A photodetector capable of normal incidence detection over a broad range of long wavelength light signals to efficiently convert infrared light into electrical signals. It is capable of converting long wavelength light signals into electrical signals with direct normal incidence sensitivity without the assistance of light coupling devices or schemes. In the apparatus, stored charged carriers are ejected by photons from quantum dots, then flow over the other barrier and quantum dot layers with the help of an electric field produced with a voltage applied to the device, producing a detectable photovoltage and photocurrent. The photodetector has multiple layers of materials including at least one quantum dot layer between an emitter layer and a collector layer, with a barrier layer between the quantum dot layer and the emitter layer, and another barrier layer between the quantum dot layer and the collector.

18 Claims, 4 Drawing Sheets

QUANTUM DOT INFRARED PHOTODETECTORS (QDIP)

This application claims benefit of Provisional No 60/984,324 filed May 5, 1998.

FIELD OF THE INVENTION

This invention relates to apparatus and methods for converting light signals into electrical signals. More particularly, the invention relates to a semiconductor photodetector device and a method for converting electromagnetic radiation such as infrared signals into electrical signals using self-assembled semiconductor quantum dots.

BACKGROUND TO THE INVENTION

Presently, state-of-the art photodetectors are either based on interband transitions in bulk material or quantum wells, or intersubband transitions in quantum wells. The interband transition devices operate mainly in the visible and near infrared wavelength range due to the energy difference between the conduction and valence band of semiconductors. The intersubband devices operate with multiple layers of quantum wells, in which carriers are confined to quantum dimensions in 1 direction (perpendicular to the surface of the device), and are free to move in the other 2 directions (in the plan of the quantum wells).

Such quantum well infrared photodetectors (QWIPs) are being used successfully for detecting InfraRed (IR) light for detectors and sensors and for imaging purposes. A major limitation of these QWIPs is that due to the transition selection rules they are not sensitive to normally incident light, and only have narrow response range in the IR. Consequently, normal incidence detection over a broad range in the IR can only be achieved with complicated light coupling devices and/or schemes, and by combining layers with different sets of quantum wells each having its own narrow response range.

SUMMARY OF THE INVENTION

Multiple layers of Self-Assembled Quantum Dots (QD) can be grown by epitaxy of highly strained semiconductors embedded in barrier spacers. Due to the small size of the quantum dots, which typically have diameters of about 200 Angstroms, quantum mechanics dictate the energy position of energy levels allowed in the quantum dots. Infrared light detection is achieved by the transitions of charged carriers from confined energy levels in the quantum dots to higher confined energy levels in the quantum dots, and/or from confined energy levels in the quantum dots to higher energy states in the wetting layer which is formed underneath the quantum dots in the self-assembling growth, and/or from confined energy levels in the quantum dots to higher energy states in the barrier material.

In contrast to the QWIPs, QDIPs are sensitive at normal incidence, and have a broad response range. The QDIPs do not suffer from the normal incidence limitation because of the unique symmetry resulting from confining the carriers in all 3 directions, and have a much broader response range in the infrared compared to the present QWIP design because the self-assembled quantum dots naturally grow with an inhomogeneous broadening in the size dispersion and with intersublevel energies which are both suitable for the long wavelength range. Growth and fabrication can be accomplished with well established and simple growth and fabrication techniques.

There has been a real need for photodetectors capable of normal incidence detection over a broad range to efficiently convert infrared light into electrical signals, which is satisfied by the present invention, which provides an apparatus and method capable of converting broad ranges of long wavelength light signals into electrical signals with good efficiencies.

The present invention also provides an apparatus and method capable of converting broad ranges of long wavelength light signals into electrical signals with direct normal incidence sensitivity without the assistance of light coupling devices/schemes.

These and other embodiments are realized by apparatus and a method in which stored charged-carriers are ejected by photons from quantum dots, then flow over the other barrier and quantum dot layers with the help of an electric field produced with a voltage applied to the device, therefore resulting in a detectable photovoltage and photocurrent.

The apparatus takes the form of a photodetector comprising multiple layers of semiconductor materials including a least 1 quantum dot layer between an emitter layer and a collector layer, with a first barrier layer between the quantum dot layer and the emitter layer, and another barrier layer between the quantum dot layer and the collector. In the case where multiple quantum dot layers are used, barriers separate the quantum dot layers. The emitter and collector are preferably doped to act as a reservoir of charge carriers and to conduct the current during detection and for operation under applied bias. The charge carriers are introduced in the quantum dot layer by either doping the barrier and/or the dot layers, and/or after redistribution of the charge carriers and adjustment of the Fermi level. The level of doping in the various regions of the device and the scheme of doping is preferably adjusted to set the Fermi level such that the desired number of energy levels in the quantum dots are occupied with charge carriers to achieve the targeted range of detection wavelengths. Also preferably, the size and the number of quantum dots per unit area is adjusted from the growth parameters in conjunction with the doping to achieve the desired detection range while optimizing the detection efficiency for the wavelengths of interest. Similarly, the choice of the barrier material, height, and thickness is adjusted in conjunction with the quantum dot size to set the detection range, to select a balance between low detector capacitance and low carrier transit time, and to achieve the desired growth mode in the self-assembling growth. For multiple layers of quantum dots very thin barriers will result in coupled zero-dimensional states in vertically self-organized quantum dots, thicker barriers will result in isolated zero-dimensional states in vertically self-organized quantum dots, and thick barriers will result in isolated zero-dimensional states in uncorrelated independent quantum dot layers.

In a preferred form of the invention the layers of the semiconductor materials are grown on a substrate from materials consisting essentially of gallium, indium, aluminum, arsenic, phosphorus, and possibly nitrogen, using known techniques such as molecular beam epitaxy, or metalorganic chemical vapor deposition, or chemical beam epitaxy, with dopant such as silicon, beryllium, or other. The carriers are introduced by n-doping or p-doping the quantum dots and/or the barriers, either continuously, or using modulation doping layers.

On GaAs substrates, the quantum dot material can be InGaAs, AlInAs, InP, or other alloys of AlGaInAsP, with barriers of AlGaAs or AlGaInP. On InP substrate, the quantum dot material can be InGaAs. Alloys with nitrogen can be used with the above group III-V materials in cases where high band gap materials are desirable. On group IV substrates, Si can be used for the barrier, and SiGe or some of the group III-V materials mentioned above for the quantum dot material. The substrate is needed to give structural integrity to the very thin layers of the device and to allow proper crystal growth. The emitter and the collector are preferably doped with the type of carriers which will be used in the quantum dots to detect the infrared light. The type of charged carrier is preferably chosen in conjunction with the size of the quantum dots, and with the thickness and height of the barriers, to obtain the desired spectral response.

The photodetector is exposed to electromagnetic radiation, and in particular infrared radiation, having no required specific orientation of the polarization vector with respect to the surface of the device. Light of substantially all polarizations and angles of incidence can be detected because of the symmetry and shape of the self-assembled quantum dots which preferably take a form resembling an hemispherical cap, a lens shape, a disk shape, a pyramidal or truncated and/or rounded pyramid shape. The self-assembled quantum dots are obtained with the spontaneous island formation during the epitaxy of highly strained semiconductor materials. The details of the self-assembling growth are preferably arranged to establish the shape, symmetry, and size of the quantum dots and therefore set the quantum dot energy levels to optimize the detection response in the desired spectral range.

In accordance with an embodiment of the invention, a photodetector is comprised of multiple layers of semiconductors with an emitter, a collector, a series of quantum dot layers disposed between the emitter and collector layer with barriers separating the quantum dot layers, a first barrier layer between the emitter layer and the series of quantum dot layers, and a last barrier layer between the collector layer and the series of quantum dot layers. The quantum dot layers have one or more zero-dimensional levels confined below the barrier energy, with the quantum dot energy levels containing some charge carriers that can be excited to higher energy levels using incident photons and flow from the quantum dots to the collector with the charge carriers that can be replaced by other charge carriers originating from the emitter.

In accordance with another embodiment, a method of producing self-assembled quantum dots having an adjustable number of confined levels and having an adjustable intersublevel spacing which relies on spontaneous island formation during the epitaxy of highly strained semiconductors comprises selecting a barrier material and a quantum dot material wherein the amount of their lattice-mismatch dictates the critical thickness required to obtain the spontaneous island formation, and their bandgap difference determines the possible number of confined states in conjunction with the intersublevel spacing, growing some thickness of the barrier material which has a lattice constant close to the lattice constant of the substrate used, depositing, at a specified growth rate, the quantum dot material at a substrate temperature which will produce quantum dots having the appropriate size to obtain the intersublevel spacing, stopping the growth of the quantum dot material after the desired number of quantum dots per unit area is reached, pausing the growth for a predetermined amount of time to allow for self-assembling growth to form the quantum dots in shapes and sizes which will give the intersublevel spacing, and growing a thickness of the barrier material to cover the quantum dots and return to a planar growth front at a substrate temperature which may be varied during the growth and which will optimize the quality of the quantum dots.

In accordance with another embodiment, a method of converting light signals to electrical signals is comprised of storing charged carriers in semiconductor quantum dots having zero-dimensional levels established by the size and composition of the quantum dots and the height of the confining potential of the barriers, exposing the quantum dots to electromagnetic radiation having sufficient energy to eject stored carriers from the quantum dot layers by photoemission, and applying a bias voltage across emitter and collector layers between which a series of quantum dot layers containing the quantum dots are located and which quantum dot layers, emitter and collector layers are separated by barriers, and cause the carriers ejected from the quantum dot layers by photoemission to flow to the collector, while replacing the ejected carriers from the quantum dot layers with carriers originating from said emitter.

In accordance with another embodiment, a photodetector is comprised of multiple layers of quantum dots and a barrier separating each layer of quantum dots from an adjacent layer of quantum dots, an emitter layer and a collector layer, and a corresponding barrier separating each of the emitter layer and collector layer from an adjacent layer of quantum dots on respective opposite ends of the multiple layers of quantum dots, conductors for applying a bias voltage between the collector and emitter, and means for allowing electromagnetic radiation to be exposed to at least some of the layers of quantum dots.

BRIEF INTRODUCTION TO THE DRAWINGS

A better understanding of the invention can be gained from the following detailed description of the preferred embodiments when read in conjunction with the accompanying drawings in which.

DETAILED DESCRIPTION OF THE EMBODIMENTS OF THE INVENTION

Figure 1:
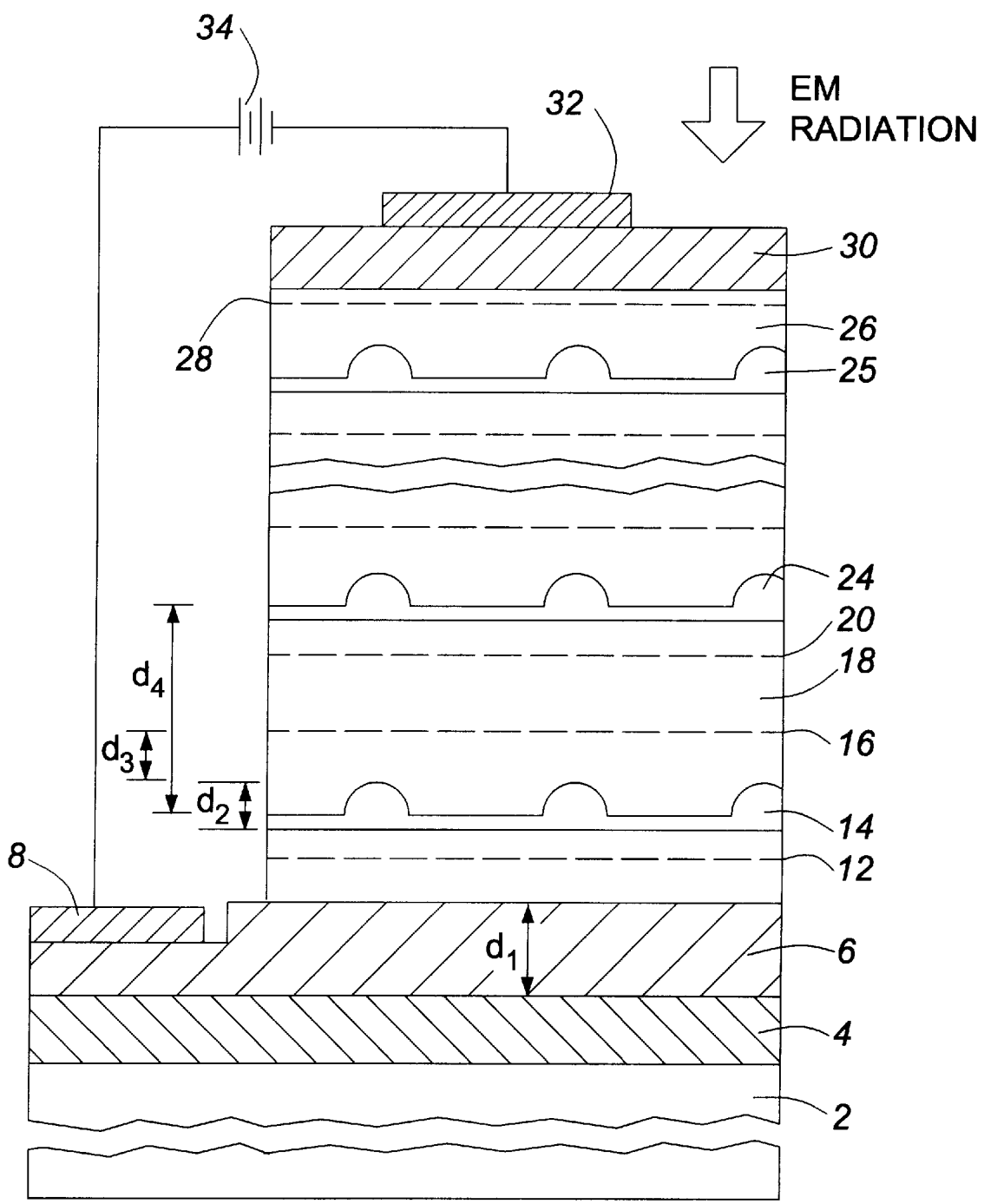
FIG. 1 is a partial, greatly magnified view of the layer structure of a photodetector in accordance with an embodiment of the invention.

FIG. 1 illustrate a portion of the photodetector in accordance with an embodiment of the invention. The photodetector comprises multiple layers of semiconductor materials. These layers include, from bottom to top, a bottom contact layer 6 which serves as a collector or an emitter which will preferably be doped to provide carriers and for conductivity, a first barrier layer 12 which can be doped continuously or modulation doped as shown to provide carriers and for conductivity, and at least a first quantum dot layer 14.

For enhanced performance, the photodetector will preferably have multiple layers of quantum dots, in which case a barrier 18 will separate the first quantum dot layer 14 from a second quantum dot layer 24. The barrier 18 can be doped continuously or modulation doped (16 and 20) to provide carriers and for conductivity. In the case of modulation doping, multiple layers of doping can be used in the barrier 18. For example FIG. 1 illustrates the case where two modulation doped layers 16 and 20 are used.

The distance d3 between the quantum dot layer 14 and the doped layer 16 can be adjusted to optimize the number of carriers and to engineer the built-in field after the charge transfer which occurs in modulation doping. Similarly additional quantum dot layers and barriers can be added until the preferred number of quantum dot layers is reached, the quantum dot layers being separated by a barrier, giving a repeating sequence with a period d4. The last quantum dot layer 25 is followed by the last barrier layer 26 which can be doped continuously or modulation doped as shown at 28 to provide carriers and for conductivity.

Following the last barrier layer 26, a top contact 30 serves as the other of a collector or an emitter which will preferably be doped to provide carriers and for conductivity. These layers are very thin; for instance in a preferred form of the device described below, the thickness d2 of a quantum dot together with the wetting layer which forms below the quantum dots is about 45 Angstroms. Hence, it is necessary to provide a substrate 2 on which to grow the layers and to give structural integrity to the device. The substrate 2 should typically have a thickness between 0.1 and 1 mm and should be covered with a buffer layer 4 below the bottom contact 6. The buffer layer 4 serves to initiate proper growth conditions and to establish the desired conductivity between the substrate 2 and the bottom contact 6.

The substrate 2 and buffer layer 4 can be either conductive or insulating depending on the optical and electrical properties desired for these layers. Undoped buffer 4 and substrate 2 is preferred in the cases where the transmission of the long wavelength light through the bottom of the structure is of consideration, and conducting buffer 4 and substrate 2 is preferred in the cases where it is desirable to have a bottom electrical contact 8 be conductive through to the substrate 2.

In a preferred embodiment a planar geometry is obtained by exposing the bottom contact 6 in some region of the device using lithography and etching techniques such as wet etchings or dry etchings after mask patterning. Photocurrent and photovoltage 10 can be measured between the bottom metal contact 8 and a top metal contact 32 which makes ohmic contacts with the top contact 30. Contacts 8 and 32 can be used to apply a bias voltage 34 to the photodetector.

As mentioned above, in a preferred form of the invention the layers of the semiconductor materials are grown on a substrate 2 from materials consisting essentially of gallium, indium, aluminum, arsenic, phosphorus, and possibly nitrogen, using known techniques such as molecular beam epitaxy, or metaloorganic chemical vapor deposition, or chemical beam epitaxy, with dopant such as silicon, beryllium, or other. The carriers are introduced by n-doping or p-doping the quantum dots and/or the barriers, either continuously (for example throughout most of the top contact 30 and bottom contact 6), or using modulation doping layers (for example 12, 16, 20, 28, etc. in the barrier layers).

On GaAs substrates 2, the quantum dot material 14 and 24 can be $In_{x1}Ga_{1-x1}As$, $In_{x2}Al_{1-x2}As$, InP, or other alloys of $Al_{x4(1-x3)}Ga_{(1-x4)(1-x3)}In_{x3}As_{y1}P_{1-y1}$, with barriers of $Al_{x5}Ga_{1-x5}As$ or $Al_{(1-x7)(1-x6)}Ga_{x7\,(1-x6)}In_{x6}P$. On InP substrate 5, the quantum dot material can be $In_{x8}Ga_{1-x8}As$. Alloys with nitrogen can be used with the above group III-V materials in cases where high band gap materials are desirable. On group IV substrates, Si can be used for the barrier, and $Si_{x9}Ge_{1-x9}$ or some of the group III-V materials mentioned above for the quantum dot material. In the exemplary embodiment of the invention, the substrate 2 is GaAs; the quantum dot layers (14, 24, etc) consist essentially of $In_{x1}Ga_{1-x1}As$ wherein x1 equals 0.15 to 1, preferably about 0.5 to 1 and specifically 1; the barriers (12, 18, 26, etc) consists of $Al_{x5}Ga_{1-x5}As$ with x5 equals to 0 to 1, preferably about 0 to 0.4, and more preferably 0.

The emitter and the collector are preferably doped with the type of carriers which will be used in the quantum dots to detect infrared light. The type of charge carrier is preferably chosen in conjunction with the size of the quantum dots, and with the thickness and height of the barriers, to obtain the desired spectral response. In the exemplary embodiment of the invention, the carriers are electrons provided by silicon doping.

In the case where multiple layers are used to increase the response of the photodetector, preferably, all barriers (12, 18, 26, etc) and quantum dot layers (14, 24, etc) can respectively have the same nominal alloy composition and thicknesses, but alternatively, the value of the alloy composition, doping, and thicknesses of each layer can be set individually to tailor the response of the photodetector to specific requirements. In particular, the material chosen, the alloy and size of the quantum dots can be changed throughout the stack of multiple layers to vary the quantum dot energy levels and therefore provide a wider range of spectral response.

The amount of semiconductor material required to form the self-assembled quantum dots (14, 24, etc.) depends on the relative strain between the substrate 2 and the quantum dots. The number of quantum dots per unit area can be adjusted by varying the amount of material deposited in the quantum dot layers. The size of the quantum dots can be adjusted by the substrate temperature used during the growth of each quantum dot layer. As mentioned above, the size and the number of quantum dots per unit area is adjusted from these growth parameters in conjunction with the doping to achieve the desired detection range while optimizing the detection efficiency for the wavelengths of interest. Similarly, the choice of the barrier material, height, and thickness is adjusted in conjunction with the quantum dot size to set the detection range, to select a balance between low detector capacitance and low carrier transit time, and to achieve the desired growth mode in the self-assembling growth. For multiple layers of quantum dots, very thin barriers will result in coupled zero-dimensional states in vertically self-organized quantum dots, thicker barriers will result in isolated zero-dimensional states in vertically self-organized quantum dots, and thick barriers will result in isolated zero-dimensional states in uncorrelated independent quantum dot layers.

Figure 2:
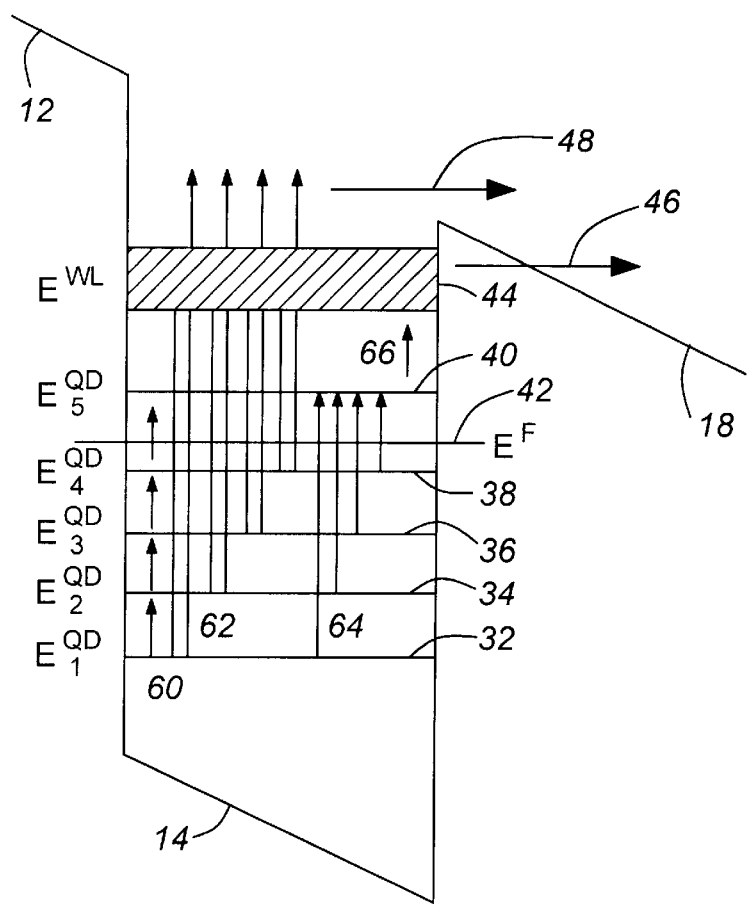
FIG. 2 is a schematic energy level diagram depicting transitions which can be used to detect the light with the photodetector of FIG. 1.

FIG. 2 illustrates a partial band diagram for a quantum dot layer of the device of FIG. 1. In this figure, the vertical direction represents the energy of the carriers in the structure, and the horizontal direction represents the position of the carriers within the photodetector structure. Due to the small size of the quantum dots 14, quantum mechanics will dictate the values of energy levels (32,34,36,38,40,44) localized in the low band gap material 14 by the barriers 12 and 18. The shape of the zero-dimensional potential gives rise to a series of discrete, atomic-like, energy levels $E^{QD}_1$ (32), $E^{QD}_2$ (34), $E^{QD}_3$ (36), $E^{QD}_4$ (38), $E^{QD}_5$ (40), below the wetting layer subband $E^{WL}$ (44). For self-assembled quantum dots, the degeneracy of these levels is typically 2 n where n is the index of the level with, n=1 for the ground state, n=2 for the first excited state, etc., where the factor of 2 comes from the spin degeneracy, and the factor n originates from the various allowed angular momenta.

The self-assembled quantum dots effectively give a zero-dimensional potential with a quasi-parabolic confinement, and consequently the energy spacing between the adjacent levels (also called the intersublevel spacing) is roughly constant between the various levels. The number of allowed energy levels and intersublevel spacing is determined by the shape and size of the quantum dot, the height of the confining potential between the barriers (12, 18) and the quantum dot (14), and by the carrier effective mass. Experimental assessment of these energy levels can be obtained by probing the interband transitions and observing the state filling in photoluminescence.

Figure 3:
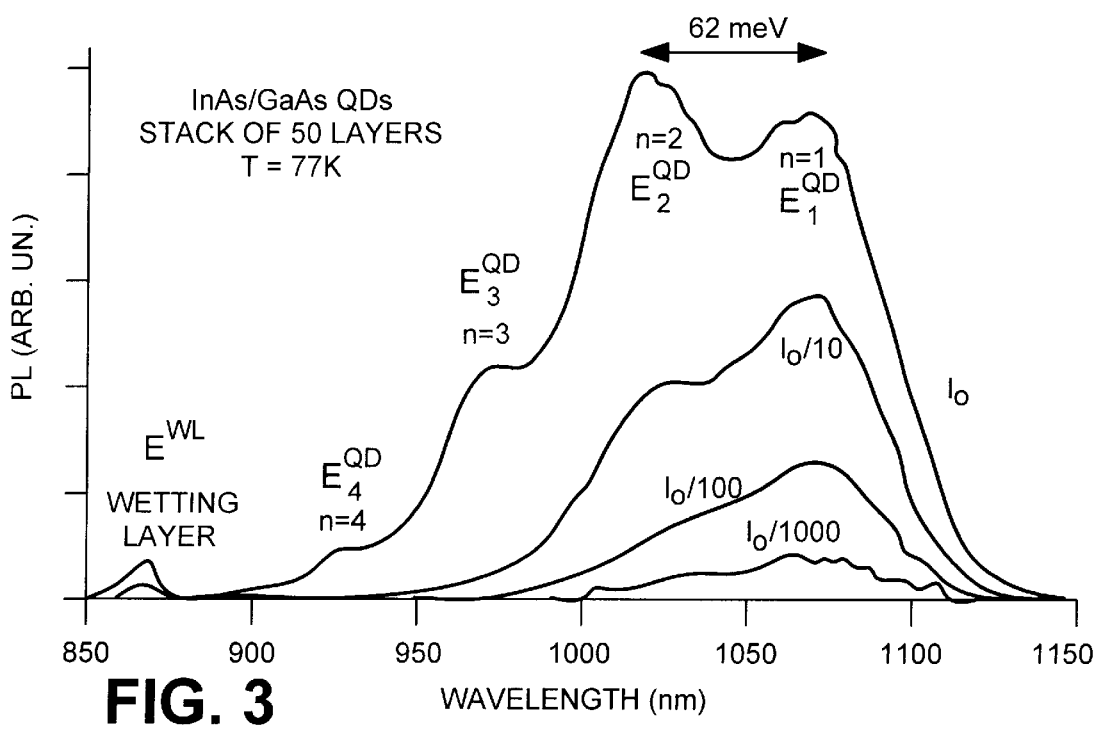
FIG. 3 is a 77K photoluminescence spectra demonstrating the good optical quality of a QDIP photodetector structure grown with 50 layers of InAs quantum dots with GaAs barriers, and revealing interband transitions involving the energy levels depicted in FIG. 2.

For example, FIG. 3 is a 77K photoluminescence spectra which demonstrate the good optical quality of an exemplary QDIP photodetector structure grown with 50 layers of InAs quantum dots, modulation-doped with electrons in GaAs barriers. The spectra of FIG. 3 reveal interband transitions involving the energy levels depicted in FIG. 2, with the wetting layer transition and 4 quantum dot transitions. The intersublevel spacing measured for this photodetector is about 60 meV for the total of both the electron and the hole contributions, of which about ⅔ originates from the electron intersublevel spacing. It can therefore be concluded that the electron intersublevel spacing for these quantum dots is about 40 meV.

The carriers are introduced by doping and fill the quantum dot energy levels up to the Fermi level $E_F$ (42) (see FIG. 2) in accordance with the level degeneracy, Hund's rule for filling orbitals, and Coulomb interaction and renomalization energies. For example, first the ground state $E^{QD}_1$ (32) can accommodate 2 carriers, one spin up, and one spin down, then the first excited state $E^{QD}_2$ (34) can accommodate 4 carriers 2 spin up and 2 spin down, etc. The level of doping is therefore determined taking into account the desired position of the Fermi level 42 in the quantum dot to fill the appropriate number of energy levels. This will determine which energy levels and intersublevel transitions will participate in the photodetection given that transitions are improbable to originate from empty energy levels above the Fermi level and improbable if the final energy level is completely filled.

For example, modulation doping to a level of $1\times10^{11}$ cm$^2$ gives 1000 carriers/$\mu$m$^2$, giving 10 carriers/QD for a quantum dot density of 100 QD/$\mu$m$^2$. The infrared light detection will be achieved by the photon-mediated transitions of charged carriers from confined energy levels in the quantum dots (32,34,36,38) to higher confined energy levels in the quantum dots (40), and/or from confined energy levels in the quantum dots (32,34,36,38) to higher energy states in the wetting layer (44) which is formed underneath the quantum dots in the self-assembling growth, and/or from confined energy levels in the quantum dots (32,34,36,38) to higher energy states in the barrier material (48). Light of sufficient energy will excite the carriers from a lower quantum dot energy level to the upper energy levels allowing the carriers to overcome the barrier 18, and then relax moving along the band edge toward the collector 30. An electric field 46 can be applied to the photodetector by applying a bias across the emitter 6 and the collector 30 (FIG. 1), to assist with the photocarrier flow 48 and the tunneling across the barriers due to the electric field 46. If light is continuously applied to the quantum dots 14, a continuous stream of carriers will be excited out of the quantum dots and travel along the band edge to the collector 30. The barrier layer dimensions are such as to allow a continuous tunneling of carriers from the emitter 6 through the barriers to the quantum dots 14 at a rate sufficient to replace the carriers depleted from the quantum dots by photoemission. Therefore it is possible for the QDIP photodetector to continuously convert the energy of a light signal into an electrical signal.

When used as a photodetector for high speed, the pulsed light signal will cause a burst of carriers to be excited out of the quantum dots and flow to the collector 30. The rate at which the carriers can tunnel though the barrier layers to the quantum dots must then at least be as great as the rate at which the carriers are depleted from the quantum dots by the pulsed light signal through photoemission.

The QDIPs will not suffer from the normal incidence limitation because the unique symmetry resulting from confining the carriers in all 3 directions will give finite matrix elements for intersublevel transitions with a polarization vector in any arbitrary direction. It is also expected that the localized nature of the level of origin in the intersublevel transition can contribute to having low dark current. The QDIP photodetector will have a much broader response range in the infrared compared to typical QWIP designs because the self-assembled quantum dots naturally grow with an inhomogeneous broadening in the size, and/or composition and/or strain. For example a photodetector with an active area of 100 microns by 100 microns with 50 layers of quantum dots having an average density of 100 QD/square-micron will contain 50 million quantum dots having small differences in the values of their energy levels. With various possible scenarios for the intersublevel transitions as described above, a broad spectral range of response in the infrared with good efficiency is obtained.

Figure 4:
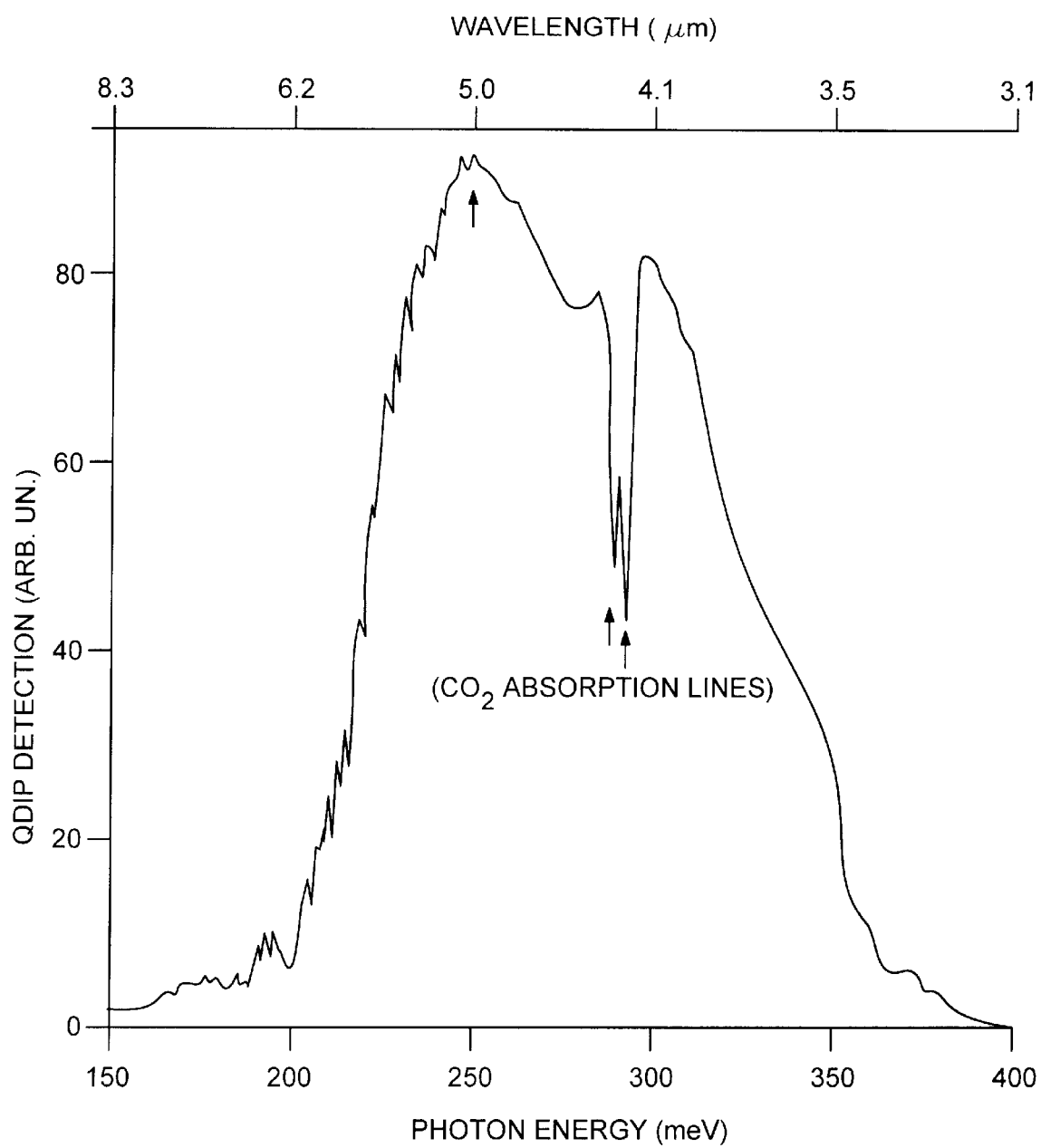
FIG. 4 is an example of spectral response measured with a QDIP photodetector with 50 layers of InAs quantum dots with $Al_{0.35}Ga_{0.65}As$ barriers.
Figure 5:
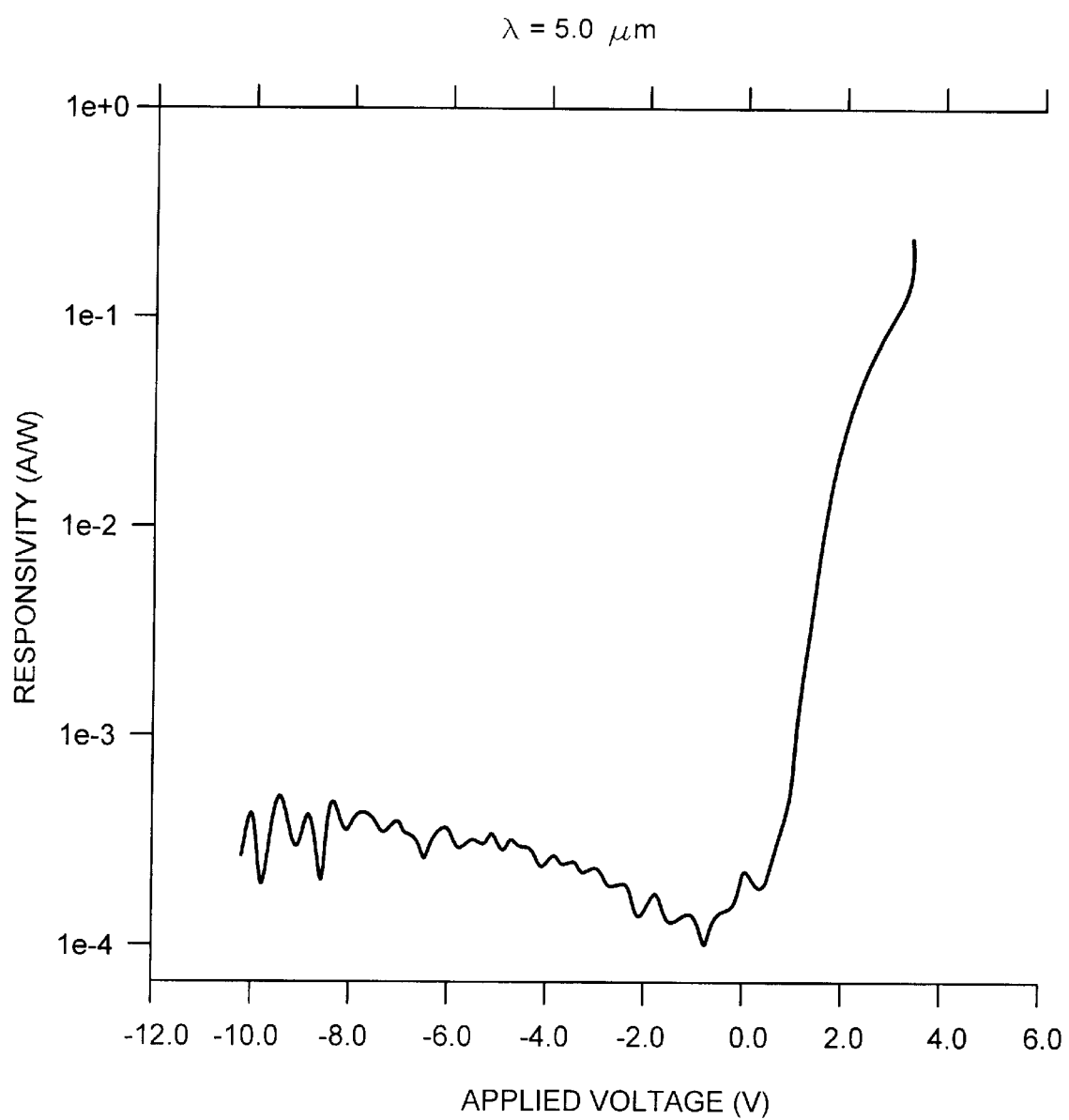
FIG. 5 is an example of the responsivity measured as a function of the voltage applied on the QDIP photodetector of FIG. 4 for a detection wavelength of 5 microns.

FIG. 4 is an example of spectral response measured with light incident normal on a QDIP photodetector with 50 layers of InAs quantum dots with $Al_{0.35}Ga_{0.65}As$ barriers modulation doped with electrons, and FIG. 5 is an example of the responsivity measured as a function of the voltage applied on the same QDIP photodetector of FIG. 4 for a detection wavelength of 5 microns. It can be appreciated that the QDIP photodetector has a broad range of detection (here between about 3.5 microns and 6.2 microns), with peak responsivity reaching close to 1 A/W at a wavelength of 5 microns. It should be noted from the above that the QDIP has a good response at normal incidence over a broad range of wavelengths. For many applications, it is believed that the overall responsivity would be proportional to the wavelength-integrated response which would be higher than the one shown in FIG. 5 by a factor directly proportional to the bandwidth of the response.

Because the fabrication of the quantum dots relies on the self-assembling growth which can combine highly mismatched semiconductor material, the QDIP photodetectors provide an enhanced liberty in the choice of the semiconductor used for the fabrication. This results in a great coverage of possible wavelengths of operation, in addition to the broad range of response for any particular design of device as discussed above. The upper limit in energy is limited by how deep the level 32 can be with respect to level 48 (FIG. 2), giving a minimum wavelength of about 1.2 microns for a high barrier and a deep quantum dot. There is no similar restriction at long wavelengths because the quantum dot size and energy levels can be tailored to make the transitions shallow and/or adjust the intersublevel spacing to a small value allowing detection up to 50 microns and possibly beyond. For longer wavelengths however, it will be desirable to operate the device at lower temperatures to avoid thermal excitation of the carriers to the upper levels which causes larger dark current and reduced detectivity.

The QDIP as described herein is based on zero-dimensional heterostructures and can benefit from the properties unique to quantum dots. One obvious advantage gained from using quantum dots in the present invention is that the QDIP is sensitive at normal incidence. The QDIP can also have a broad response range due the inhomogeneous broadening in the ensemble of quantum dots and due to the possibility of various intersublevel transitions. For QDIPs having a wide wavelength response range, the wavelength-integrated responsivity is greatly enhanced. For QDIPs where the wavelength response range is made as narrow as possible, the peak responsivity is greatly enhanced. The QDIP also provides low dark currents. The self-assembled growth method used offers a wide range of possible materials with large lattice mismatched between the semiconductors, therefore increasing the choice of available material for fabrication.

A person understanding the above-described invention may now conceive of alternative designs, using the principles described herein. All such designs which fall within the scope of the claims appended hereto are considered to be part of the present invention.

We claim:

1. A photodetector comprising multiple layers of semiconductors with:
   an emitter;
   a collector;
   a series of quantum dot layers disposed between said emitter and collector layer with barriers separating the quantum dot layers;
   a first barrier layer having a barrier energy between the emitter layer and the series of quantum dot layers; and
   a last barrier layer having said barrier energy between the collector layer and the series of quantum dot layers;
   the quantum dot layers having one or more zero-dimensional levels confined below the barrier energy, with the quantum dot energy levels containing some charge carriers that can be excited to higher energy levels using incident photons and which charge carriers flow from the quantum dots to the collector, and the charge carriers being replaced by other charge carriers originating from the emitter.

2. The photodetector of claim 1 in which the quantum dot layers are produced using a self-assembled growth method.

3. The photodetector of claim 2 further comprising a wetting layer underneath the quantum dots, wherein one or more zero-dimensional levels are confined below the barrier energy, and one two-dimensional subband for the wetting layer also being confined below the barrier energy but above the zero-dimensional levels of the quantum dots, which contain some charged carriers that can be excited to higher energy levels, which flow from the quantum dots to the collector.

4. The photodetector of claim 3 in which the thickness and composition of the first barrier layer is such as to allow tunneling of the carriers from the emitter to the quantum dot layers at a rate which is at least as great as the rate of depletion of carriers from the quantum dot layer by photoemission.

5. The photodetector of claim 3 in which the doping in the emitter, barrier, and quantum dot layers are such that after the charge transfer and tunneling, the Fermi levels of the emitter layer and quantum dot layers equalize and fill the appropriate number of energy levels in the quantum dot layers to obtain a desired detection range.

6. The photodetector of claim 3 wherein the thickness of the barrier layers is selected, in association with the thickness and doping of the collector, to provide a balance between low detector capacitance and low electron transit time, and to set a response time of the photodetector.

7. The photodetector of claim 3 wherein the quantum dot layers are comprised of gallium, indium, aluminum and arsenic.

8. The photodetector of claim 7 wherein the barrier layers are comprised of $Al_{x1}Ga_{1-x1}As$ and the quantum dots are comprised of $Al_{x4(1-x3)}Ga_{(1-x4)(1-x3)}In_{x3}As$.

9. The photodetector of claim 8 wherein x1 is between 0 to 0.4, and x4 is about 0 and x3 is about 1.

10. The photodetector of claim 8 wherein the emitter layer is comprised essentially of $Al_{xE}Ga_{1-xE}As$ and the collector layer is comprised essentially of $Al_{xC}Ga_{1-xC}As$ with xE and xC both less than x1.

11. The photodetector of claim 8 capable of normal incidence detection.

12. The photodetector of claim 11 operating at a wavelength of about 5 microns with a broad response range.

13. The photodetector of claim 8 adapted for use with high incident light modulation speed.

14. The photodetector of claim 3 with N quantum dot and NH barrier layers having compositions and sizes set individually for each layer for adapting the response range of the photodetector to specific requirements, wherein the barriers are comprised of $Al_{x1i}Ga_{1-x1i}As$ and the quantum dots are comprised of $Al_{x4i(1-x3i)}Ga_{(1-x4i)(1-x3i)}In_{x3i}As$, with the index i going from 1 to N.

15. A method of converting light signals to electrical signals comprising:

storing charge carriers in semiconductor quantum dots having zero-dimensional levels established by size and composition of the quantum dots and height of the confining potential of the barriers;

exposing the quantum dots to electromagnetic radiation having sufficient energy to eject stored carriers from the quantum dot layers by photoemission; and applying a bias voltage across emitter and collector layers between which a series of quantum dot layers containing the quantum dots are located, separated by barriers, to cause the carriers ejected from the quantum dot layers by photoemission to flow to a collector, while replacing the ejected carriers from the quantum dot layers with carriers originating from an emitter.

16. A method as defined in claim 15, in which the electromagnetic radiation is incident to the quantum dots in a direction normal to the quantum dot layers.

17. A photodetector comprising:

(a) multiple layers of quantum dots and a barrier separating each layer of quantum dots from an adjacent layer of quantum dots, (b) an emitter layer and a collector layer, and a corresponding barrier separating each of the emitter layer and collector layer from an adjacent layer of quantum dots on respective opposite ends of the multiple layers of quantum dots, (c) conductors for applying a bias voltage between the collector and emitter, and (d) means for allowing electromagnetic radiation to be exposed to at least some of the layers of quantum dots.

18. A photodetector as defined in claim 17, in which the electromagnetic radiation exposure is normal to the planes of the layers of quantum dots.

* * * * *